United States Patent
Naasani et al.

(10) Patent No.: US 9,159,590 B2
(45) Date of Patent: *Oct. 13, 2015

(54) ENCAPSULATED NANOPARTICLES

(71) Applicant: Nanoco Technologies, Ltd., Manchester (GB)

(72) Inventors: Imad Naasani, Manchester (GB); James Gillies, Bolton (GB); Emma Hogarth, Leyland (GB); Xiaojuan Wang, Cambridge (GB); Ombretta Masala, Manchester (GB)

(73) Assignee: Nanoco Technologies, Ltd., Manchester (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/512,589

(22) Filed: Oct. 13, 2014

(65) Prior Publication Data

US 2015/0031217 A1 Jan. 29, 2015

Related U.S. Application Data

(63) Continuation of application No. 13/075,458, filed on Mar. 30, 2011, now Pat. No. 8,859,442.

(60) Provisional application No. 61/320,924, filed on Apr. 5, 2010.

(30) Foreign Application Priority Data

Apr. 1, 2010 (GB) .................................. 1005601.8

(51) Int. Cl.
*H01L 21/31* (2006.01)
*H01L 21/56* (2006.01)
(Continued)

(52) U.S. Cl.
CPC ................. *H01L 21/56* (2013.01); *B82Y 30/00* (2013.01); *C09C 1/10* (2013.01); *C09K 11/025* (2013.01); *C09K 11/0811* (2013.01); *C09K 11/565* (2013.01); *C09K 11/883* (2013.01); *C01P 2004/64* (2013.01)

(58) Field of Classification Search
USPC .......................................... 438/780, 781, 782
See application file for complete search history.

(56) References Cited

U.S. PATENT DOCUMENTS

| | | | |
|---|---|---|---|
| 2,769,838 A | 11/1956 | Matter et al. |
| 3,524,771 A | 8/1970 | Green |

(Continued)

FOREIGN PATENT DOCUMENTS

| | | |
|---|---|---|
| CN | 1394599 | 2/2003 |
| EP | 1176646 | 1/2002 |

(Continued)

OTHER PUBLICATIONS

Rao et. al. "The Chemistry of Nanomaterials: Synthesis, Properties, and Applications" (2004).

(Continued)

*Primary Examiner* — Kevin M Picardat
(74) *Attorney, Agent, or Firm* — Blank Rome, LLP

(57) ABSTRACT

The present invention relates to a method for producing encapsulated nanoparticles by dispersing said nanoparticles and an encapsulating medium in a common solvent to form a first solution system and treating said first solution system with a stimulus suitable to induce simultaneous aggregation of the nanoparticles and the encapsulating medium.

20 Claims, 4 Drawing Sheets

(51) Int. Cl.
*B82Y 30/00* (2011.01)
*C09C 1/10* (2006.01)
*C09K 11/02* (2006.01)
*C09K 11/08* (2006.01)
*C09K 11/56* (2006.01)
*C09K 11/88* (2006.01)

(56) References Cited

U.S. PATENT DOCUMENTS

| | | |
|---|---|---|
| 4,609,689 A | 9/1986 | Schwartz et al. |
| 6,114,038 A | 9/2000 | Castro et al. |
| 6,207,229 B1 | 3/2001 | Bawendi et al. |
| 6,221,602 B1 | 4/2001 | Barbera-guillem et al. |
| 6,261,779 B1 | 7/2001 | Barbera-guillem et al. |
| 6,322,901 B1 | 11/2001 | Bawendi et al. |
| 6,326,144 B1 | 12/2001 | Bawendi et al. |
| 6,333,110 B1 | 12/2001 | Barbera-guillem |
| 6,379,635 B2 | 4/2002 | O'Brien et al. |
| 6,423,551 B1 | 7/2002 | Weiss et al. |
| 6,426,513 B1 | 7/2002 | Bawendi et al. |
| 6,607,829 B1 | 8/2003 | Bawendi et al. |
| 6,660,379 B1 | 12/2003 | Lakowicz et al. |
| 6,699,723 B1 | 3/2004 | Weiss et al. |
| 6,815,064 B2 | 11/2004 | Treadway et al. |
| 6,855,551 B2 | 2/2005 | Bawendi et al. |
| 6,914,264 B2 | 7/2005 | Chen et al. |
| 6,992,202 B1 | 1/2006 | Banger et al. |
| 7,151,047 B2 | 12/2006 | Chan et al. |
| 7,235,361 B2 | 6/2007 | Bawendi et al. |
| 7,264,527 B2 | 9/2007 | Bawendi et al. |
| 7,544,725 B2 | 6/2009 | Pickett et al. |
| 7,588,828 B2 | 9/2009 | Mushtaq et al. |
| 7,674,844 B2 | 3/2010 | Pickett et al. |
| 7,803,423 B2 | 9/2010 | O'Brien et al. |
| 7,867,556 B2 | 1/2011 | Pickett |
| 7,867,557 B2 | 1/2011 | Pickett et al. |
| 7,939,170 B2 | 5/2011 | Dubertret |
| 8,859,442 B2* | 10/2014 | Naasani et al. ............ 438/780 |
| 2002/0155507 A1 | 10/2002 | Bruchez et al. |
| 2003/0017264 A1 | 1/2003 | Treadway et al. |
| 2003/0106488 A1 | 6/2003 | Huang et al. |
| 2003/0148024 A1 | 8/2003 | Kodas et al. |
| 2004/0007169 A1 | 1/2004 | Ohtsu et al. |
| 2004/0033345 A1 | 2/2004 | Dubertret et al. |
| 2004/0036130 A1 | 2/2004 | Lee et al. |
| 2004/0110002 A1 | 6/2004 | Kim et al. |
| 2004/0110347 A1 | 6/2004 | Yamashita |
| 2004/0178390 A1 | 9/2004 | Whiteford et al. |
| 2004/0250745 A1 | 12/2004 | Ogura et al. |
| 2005/0098204 A1 | 5/2005 | Roscheisen et al. |
| 2005/0129947 A1 | 6/2005 | Peng et al. |
| 2005/0145853 A1 | 7/2005 | Sato et al. |
| 2006/0019098 A1 | 1/2006 | Chan et al. |
| 2006/0057382 A1 | 3/2006 | Treadway et al. |
| 2006/0061017 A1 | 3/2006 | Strouse et al. |
| 2006/0068154 A1 | 3/2006 | Parce et al. |
| 2006/0110279 A1 | 5/2006 | Han et al. |
| 2006/0118757 A1 | 6/2006 | Klimov et al. |
| 2006/0130741 A1 | 6/2006 | Peng et al. |
| 2007/0012941 A1 | 1/2007 | Cheon |
| 2007/0034833 A1 | 2/2007 | Parce et al. |
| 2007/0059705 A1 | 3/2007 | Lu et al. |
| 2007/0104865 A1 | 5/2007 | Pickett |
| 2007/0110816 A1 | 5/2007 | Jun et al. |
| 2007/0114520 A1 | 5/2007 | Garditz et al. |
| 2007/0125983 A1 | 6/2007 | Treadway et al. |
| 2007/0131905 A1 | 6/2007 | Sato et al. |
| 2007/0199109 A1 | 8/2007 | Yi et al. |
| 2007/0202333 A1 | 8/2007 | O'Brien et al. |
| 2007/0238126 A1 | 10/2007 | Pickett et al. |
| 2008/0107911 A1 | 5/2008 | Liu et al. |
| 2008/0112877 A1 | 5/2008 | Xiao et al. |
| 2008/0121844 A1 | 5/2008 | Jang et al. |
| 2008/0160306 A1 | 7/2008 | Mushtaq et al. |
| 2008/0190483 A1 | 8/2008 | Carpenter et al. |
| 2008/0220593 A1 | 9/2008 | Pickett et al. |
| 2008/0257201 A1 | 10/2008 | Harris et al. |
| 2008/0258115 A1 | 10/2008 | Ying et al. |
| 2008/0264479 A1 | 10/2008 | Harris et al. |
| 2009/0098663 A1 | 4/2009 | Han et al. |
| 2009/0139574 A1 | 6/2009 | Pickett et al. |
| 2009/0212258 A1 | 8/2009 | Mccairn et al. |
| 2009/0263816 A1 | 10/2009 | Pickett et al. |
| 2010/0059721 A1 | 3/2010 | Pickett et al. |
| 2010/0068522 A1 | 3/2010 | Pickett et al. |
| 2010/0113813 A1 | 5/2010 | Pickett et al. |
| 2010/0123155 A1 | 5/2010 | Pickett et al. |
| 2010/0193767 A1 | 8/2010 | Naasani et al. |
| 2010/0212544 A1 | 8/2010 | Harris et al. |

FOREIGN PATENT DOCUMENTS

| | | |
|---|---|---|
| EP | 1783137 | 5/2007 |
| EP | 1854792 | 11/2007 |
| GB | 199518910.6 | 9/1995 |
| GB | 2429838 | 3/2007 |
| JP | 2005139389 | 6/2005 |
| WO | 9710175 | 3/1997 |
| WO | 0017642 | 3/2000 |
| WO | 0204527 | 1/2002 |
| WO | 0224623 | 3/2002 |
| WO | 0229140 | 4/2002 |
| WO | 03099708 | 12/2003 |
| WO | 2004008550 | 1/2004 |
| WO | 2004033366 | 4/2004 |
| WO | 2004065362 | 8/2004 |
| WO | 2004066361 | 8/2004 |
| WO | 2005021150 | 3/2005 |
| WO | 2005106082 | 11/2005 |
| WO | 2005123575 | 12/2005 |
| WO | 2006001848 | 1/2006 |
| WO | 2006017125 | 2/2006 |
| WO | 2006075974 | 7/2006 |
| WO | 2006116337 | 11/2006 |
| WO | 2006118543 | 11/2006 |
| WO | 2006134599 | 12/2006 |
| WO | 2007020416 | 2/2007 |
| WO | 2007049052 | 5/2007 |
| WO | 2007060591 | 5/2007 |
| WO | 2007065039 | 6/2007 |
| WO | 2007098378 | 8/2007 |
| WO | 2007103799 | 9/2007 |
| WO | 2008013780 | 1/2008 |
| WO | 2008054874 | 5/2008 |
| WO | 2008133660 | 11/2008 |
| WO | 2009016354 | 2/2009 |
| WO | 2009040553 | 4/2009 |
| WO | 2009106810 | 9/2009 |

OTHER PUBLICATIONS

Trinadade et al., "Nanocrystalline Semiconductors: Synthesis, Properties, and Perspectives", Chemistry of Materials, (2001) vol. 13, No. 11, pp. 3843-3858.
International Search Report for PCT/GB2009/001928 mailed Dec. 8, 2009 (3 pages).
International Search Report for PCT/GB2009/002605 mailed Feb. 22, 2010 (3 pages).
Search Report for GB0813273.0 searched Dec. 8, 2008 (1 page).
Search Report for GB0814458.6 searched Dec. 5, 2008 (2 pages).
Search Report for GB0820101.4 searched Mar. 2009 (1 page).
Search Report for GB0821122.9 searched Mar. 19, 2009 (2 pages).
Foneberov et al., "Photoluminescence of tetrahedral quantum-dot quantum wells" Physica E, 26:73-77 (2005).
Cao, "Effect of Layer Thickness on the Luminescence Properties of ZnS/CdS/ZnS quantum dot quantum well", J. of Colloid and Interface Science 284:516-520 (2005).
Harrison et al. "Wet Chemical Synthesis on Spectroscopic Study of CdHgTe Nanocrystals with Strong Near-Infrared Luminescence" Mat. Sci and Eng.B69-70:355-360 (2000).
Sheng et al. "In-Situ Encapsulation of quantum Dots into Polymer Microspheres", Langmuir 22(8):3782-3790 (2006).

(56) References Cited

OTHER PUBLICATIONS

W. Peter Wuelfing et al., "Supporting Information for Nanometer Gold Clusters Protected by Surface Bound Monolayers of Thiolated Poly (ethylene glycol) Polymer Electrolyte" Journal of the American Chemical Society (XP002529160) (1998).
International Search Report for PCT/GB2009/000510 mailed Jul. 6, 2010 (16 pages).
International Search Report for PCT/GB2008/003958 mailed Sep. 4, 2009 (4 pages).
Banger et al., "Ternary single-source precursors for polycrystalline thin-film solar cells" Applied Organometallic Chemistry, 16:617-627, XP002525473 Scheme 1 Chemical Synthesis (2002).
D Qi, M Fischbein, M Drndic, S. Selmic, "Efficient polymer-nanocrystal quantum-dot photodetectors", Appl. Phys. Lett., 2004, 84,4295.
Shen et al., "Photoacoustic and photoelectrochemical characterization of CdSe-sensitized Ti02 electrodes composed of nanotubes and nanowires" This Solid Films, Elsevier-Sequoia S.A. Lausanne, CH vol. 499, No. 1-2, Mar. 21, 2006, pp. 299-305,XP005272241 ISSN: 0040-6090.
Smestad GP, et al., "A technique to compare polythiophene solid-state dye sensitized Ti02 solar cells to liquid junction devices" Solar Energy Materials and Solar Cells, Elsevier Science Publishers, Amsterdam, NL, vol. 76, No. 1, Feb. 15, 2003, pp. 85-105, XP004400821 ISSN: 0927-0248.
Chen et al., "Electrochemically synthesized CdS nanoparticle-modified Ti02 nanotube-array photoelectrodes: Preparation, characterization, and application to photoelectrochemical cells" Journal of Photochemistry and Photobiology, a: Chemistry, Elsevier Sequoia Lausanne, CH, vol. 177, No. 2-3, Jan. 25, 2006, pp. 177-184, XP005239590 ISSN: 1010-6030.
Wang, et al., "In situ polymerization of amphiphilic diacetylene for hole transport in solid state dye-sensitized solar cells" Organic Electronics, El Sevier, Amsterdam NL, vol. 7, No. 6, Nov. 18, 2006, pp. 546-550, XP005773063 ISSN: 1566-1199.
International Search Report and Written Opinion for PCT/GB2008/001457 mailed Aug. 21, 2008 (14 pages).
Richardson et al., "Chemical Engineering: Chemical and Biochemical Reactors and Process Control," vol. 3, Third Edition pp. 3-5 (1994).
Borchert et al., "High Resolution Photoemission STudy of CdSe and CdSe/ZnS Core-Shell Nanocrystals," Journal of Chemical Physics, vol. 119, No. 3 pp. 1800-1807 (2003).
Gaponik et al., "Thiol-Capping of CdTe Nanocrystals: An Alternative to Organometallic Synthetic Routes," Journal of Physical Chemistry B, vol. 106, No. 29, pp. 7177-7185 (2002).
Pickett et al., "Syntheses of Semiconductor Nanoparticles Using Single-Molecular Precursors," The Chemical Record, vol. 1 pp. 467-479 (2001).
Hu et al., Solar Cells: From basics to advanced systems. McGraw-Hill Book Co. pp. 73-74 (1983).
Talapin et al. "Synthesis of Surface-Modified Colloidal Semiconductor Nanocrystals and Study of Photoinduced Charge Separation and Transport in Nanocrystal-Polymer Composites," Physica E, vol. 14, pp. 237-241 (2002).
Written Opinion of Preliminary International Search Report for Application No. PCT/GB2011/000438, dated Oct. 11, 2012.
Ziegler, J., et al. "Silica-Coated InP/ZnS Nanocrystals as Converter Material in White LEDs," Advanced Materials, col. 20, 2008, pp. 4068-4073, XP002639985, Wiley.
International Search Report and Written Opinion for Application No. PCT/GB2011/000438, dated Jun. 27, 2011.
Agger, J. R. et al., J. Phys. Chem. B (1998) 102, p. 3345.
Aldana, J. et al. "Photochemical Instability of CdSe Nanocrystals Coated by Hydrophilic Thiols", J. Am. Chem. Soc. (2001), 123: 8844-8850.
Arici et al., Thin Solid Films 4510452 (2004) 612-618.
Battaglia et al., "Colloidal Two-dimensional Systems: CdSe Quantum Shells and Wells, " Angew Chem. (2003) 115:5189.

Bawendi, M.G. The Quantum Mechanics of Larger Semiconductor Clusters ("Quantum Dots"), Annu. Rev. Phys. Chem. (1990), 42: 477-498.
Allivisatos, A.P. "Perspectives on the Physical Chemistry of Semiconductor Nanocrystals", J. Phys. Chem., (1996), 100, pp. 13226-13239.
Berry, C.R. "Structure and Optical Absorption of AgI Microcrystals", Phys. Rev. (1967) 161: 848-851.
Bunge, S.D. et al. "Growth and morphology of cadmium chalcogenides: the synthesis of nanorods, tetrapods, and spheres from CdO and Cd(O2CCH3)2", J. Mater. Chem. (2003) 13: 1705-1709.
Castro et al., Chem. Mater. (2003) 15:3142-3147.
Castro et al., "Synthesis and Characterization of Colloidal CuInS2 Nanoparticles from a Molecular from a Molecular Single-Source Precursors, " J. Phys. Chem. B (2004) 108:12429.
Chun et al., Thin Solid Films 480-481 (2005) 46-49.
Contreras et al., "ZnO/ZnS(O,OH)/Cu(in,Ga)Se2/Mo Solar Cell with 18:6% Efficiency," from 3d World Conf. on Photovol. Energy Conv., Late News Paper, (2003) pp. 570-573.
Cul et al., "Harvest of near infrared light in PbSe nanocrystal-polymer hybrid photovoltaic cells," Appl. Physics Lett. 88 (2006) 183111-183111-3.
Cumberland et al., "Inorganic Clusters as Single-Source Precursors for Preparation of CdSe, ZnSe, and CdSe/ZnS Nanomaterials" Chemistry of Materials, 14, pp. 1576-1584, (2002).
Dance et al., J. Am. Chem. Soc. (1984) 106:6285.
Daniels et al., "New Zinc and Cadmium Chalcogenide Structured Nanoparticles," Mat. Res. Soc. Symp. Proc. 789 (2004).
Eychmuller, A. et al. "A quantum dot quantum well: CdS/HgS/CdS", Chem. Phys. Lett. 208, pp. 59-62 (1993).
Fendler, J.H. et al. "The Colloid Chemical Approach to Nanostructured Materials", Adv. Mater. (1995) 7: 607-632.
Gao, M. et al. "Synthesis of PbS Nanoparticles in Polymer Matrices", J. Chem. Soc. Commun. (1994) pp. 2779-2780.
Gou et al., J. Am. Chem. Soc. (2006) 128:7222-7229.
Gur et al., "Air stable all-inorganic nanocrystal solar cells processed from solution," Lawrence Berkeley Natl. Lab., Univ. of California, paper LBNL-58424 (2005).
Gurin, Colloids Surf. A (1998) 142:35-40.
Guzelian, A. et al. "Colloidal chemical synthesis and characterization of InAs nanocrystal quantum dots", Appl. Phys. Lette. (1996) 69: 1432-1434.
Guzelian, A. et al., J. Phys. Chem. (1996) 100: 7212.
Hagfeldt, A. et al. "Light-induced Redox Reactions in Nanocrystalline Systems", Chem. Rev. (1995) 95: 49-68.
Henglein, A. "Small-Particle Research: Physicochemical Properties of Extremely Small Colloidal Metal and Semiconductor Particles", Chem Rev. (1989) 89: 1861-1873.
Hirpo et al., "Synthesis of Mixed Copper-Indium Chalcogenolates. Single-Source Precursors for the Photovoltaic Materials CuInQ2 (Q=S, Se)," J. Am. Chem. Soc. (1993) 115:1597.
Hu et al., Sol. State Comm. (2002) 121:493-496.
International Search Report for PCT/GB2005/001611 mailed Sep. 8, 2005 (5 pages).
Jegier, J.A. et al. "Poly(imidogallane): Synthesis of a Crystalline 2-D Network Solid and its Pyrolysis to Form Nanocrystalline Gallium Nitride in Supercritical Ammonia", Chem. Mater. (1998) 10: 2041-2043.
Jiang et al., Inorg. Chem. (2000) 39:2964-2965.
Kaelin et al., "CIS and CIGS layers from selenized nanoparticle precursors," Thin Solid Films 4310432 (2003) pp. 58-62.
Kapur et al., "Non-Vacuum processing of CuIn 1-xGaxSe2 solar cells on rigid and flexible substrates using nanoparticle precursor inks,"Thin Solid Films 4310432 (2003) pp. 53-57.
Kher, S. et al., "A Straightforward, New Method for the Synthesis of Nanocrystalline GaAs and GaP", Chem. Mater. *1994) 6: 2056-2062.
Kim et al., "Synthesis of CuInGaSe2 Nanoparticles by Low Temperature Colloidal Route," J. Mech. Sci. Tech., Vo. 19, No. 11, pp. 2085-2090 (2005).
Law et al., "Nanowire dye-sensitized solar cells." Nature Mater. (2005) vol. 4 pp. 455-459.

(56) References Cited

OTHER PUBLICATIONS

Li et al., Adv. Mat. (1999) 11:1456-1459.
Lieber, C. et al. "Understanding and Manipulating Inorganic Materials with Scanning Probe Microscopes", Angew. Chem. Int. Ed. Engl. (1996) 35: 687-704.
Little et al., "Formation of Quantum-dot quantum-well heteronanostructures with large lattice mismatch: Zn/CdS/ZnS," 114 J. Chem. Phys. 4 (2001).
Lu et al., Inorg. Chem. (2000) 39: 1606-1607.
LOver, T. et al. "Preparation of a novel CdS nanocluster material from a thiophenolate-capped CdS cluster by chemical removal of SPh ligands", J. Mater. Chem. (1997) 7(4): 647-651.
Malik et al., Adv. Mat., (1999) 11:1441-1444.
Matijevic, E., "Mondispersed Colloids: Art and Science", Langmuir (1986) 2:12-20.
Matijevic, E. "Production of Mondispersed Colloidal Particles", Ann. Rev. Mater. Sci. (1985) 15: 483-518.
Mekis, I. et al., "One-Pot Synthesis of Highly Luminescent CdSe/CdS Core-Shell Nanocrystals via Organometallic and "Greener" Chemical Approaches", J. Phys. Chem. B (2003) 107: 7454-7462.
Mews et al., J. Phys. Chem. (1994) 98-934.
Micic et al., "Synthesis and Characterization of InP, GaP, and GainP2 Quantum Dots", J. Phys. Chem. (1995) pp. 7754-7759.
Milliron et al., "Electroactive Surfactant Designed to Mediate Electron Transfer between CdSe Nanocrystals and Organic Semicondictors," Adv. Materials (2003) 51, No. 1, pp. 58-61.
Murray, C.B. et al., "Synthesis and Characterization of Nearly Monodisperse CdE (E=S, Se, Te) Semiconductor Nanocrystallites", J. Am. Chem. Soc. (1993) 115 (19) pp. 8706-8715.
Nairn et al., Nano Letters (2006) 6:1218-1223.
Nazeeruddin et al., "Conversion of Light to Electricity by sic-X2Bis(2,2'bipyridy1-4,4'-dicarboxylate)ruthenium(II) Charge-Transfer Sensitizers (X=C1-,Br-,I-,Cn-, and SCN-) on Nanocrystalline TiO2 Electrodes," J. Am.Chem. Soc. (1993) 115:6382-6390.
Nazeeruddin et al., "Engineering of Efficient Panchromatic Sensitizers for Nanocrystalline TiO2—Based Solar Cells," J. Am. Chem. Soc. (2001) 123:1613-1624.
O'Brien A. et al., "The Growth of Indium Selenide Thin Films from a Novel Asymmetric Dialkydiselenocarbamate," Chem. Vap. Depos. 4, pp. 227 (1979).
Olshaysky, M.A., et al. "Organometallic Synthesis of GaAs Crystallites Exhibiting Quantum Confinement", J. Am. Chem. Cos. (1990) 112: 9438-9439.
Olson et al., J. Phyus. Chem. C. (2007) 111:16640-16645.
Patents Act 1977: Search Report under Section 17 for Application No. GB0409877.8 dated Oct. 7, 2004 (2 pages).
Patent Act 1977 Search Report under Section 17 for Application No. GB0522027.2 dated Jan. 27, 2006 (1 page).
Patent Act 1977 Search REport ;under Section 17 for Application No. GB0606845.6 dated Sep. 14, 2006.
Patent Act 19077 Search Report under Section 17 for Application No. GB0719073.9 dated Feb. 29, 2008.
Patent Act 1977 Search Report under Section 17 for Application No. GB0719075.4 dated Jan. 22, 2008.
Patent Act 1977 Search Report under Section 17 for Application No. GB0723539.3 dated Mar. 27, 2008 (1 page).
Peng et al., "Mechanisms of the Shape Evolution of CdSe Nanocrystals", J. Am. Chem. Soc. (2001) 123:1389.
Peng et al., "Kinetics of I-VI and III-V Colloidal Semiconductor Nanocrystal Growth: "Focusing" os Size Distributions", J. Am. Chem. Soc., (1998) 129: 5343-5344.
Peng et al., "Shape control of CdSe nanocrystals", Nature, (2000) vol. 404, No. 6773, pp. 59-61.
Pradhan, N. et al. "Single-Precursor, One-Pot Versatile Synthesis under near Ambient Conditions of Tunable, Single and Dual Band Flourescing Metal Sulfide Nanoparticles", J. Am. Chem. Soc. (2003) 125: 2050-2051.
Qi et al., "Efficient polymer-nanocrystal quantum-dot photodetectors," Appl. Physics Lett. 86 (2005) 093103-093103-3.
Qu, L. et al. "Alternative Routes toward High Quality CdSe Nanocrystals", Nano Lett. (2001) vol. 1, No. 6, pp. 333-337.
Robel et al., "Quantum Dot Solar Cells. Harvesting Light Energy with CdSe Nanocrystals Molecularly Linked to Mesoscopic TiO2 Films," J. Am. Chem. Soc. (2006) 128: 2385-2393.
Salata, O.V. et al. "Uniform GaAs quantum dots in a polymer matrix", Appl. Phys. Letters (1994) 65(2): 189-191.
Sercel, P.C. et al. "Nanometer-scale GaAs clusters from organometallic percursors", Appl. Phys. Letters (1992) 61:696-698.
Shulz et al., J. Elect. Mat. (1998) 27:433-437.
Steigerwald, M.L. et al. "Semiconductor Crystallites: A Class of Large Molecules", Acc. Chem. Res. (1990) 23:183-188.
Stroscio, J.A. et al. "Atomic and Molecular manipulation with the Scanning Tunneling Microscope", Science (1991), 254: 1319-1326.
Trinidade et al., "A Single Source Spproach to the Synthesis of CdSe Nanocrystallites", Advanced Materials, (1996) vol. 8, No. 2, pp. 161-163.
Vayssieres et al., "Highly Ordered SnO2 Nanorod Arrays from Controlled Aqueous Growth," Angew. Chem. Int. Ed. (2004) 43: 3666-3670.
Wang Y. et al. "PbS in polymers, From molecules to bulk solids", J. Chem. Phys. (1987) 87: 7315-7322.
Weller, H. "Colloidal Semiconductor Q-Particles: Chemistry in the Transition Region Between Solid State and Molecules", Angew. Chem. Int. Ed. Engl. (1993) 32: 41-53.
Weller, H. "Quantized Semiconductor Particles: A Novel State of Mater for Materials Science", Adv. Mater. (1993) 5: 88-95.
Wells, R.L. et al. "Synthesis of Nanocrystalline Indium Arsenide and Indium Phosphide from Indium(III) Halides and Tris (trimethylsilyl)pnicogens. Synthesis, Characterization, and Decomposition Behavior of I3In-P(SiMe3)3", Chem. Mater. (1995) 7: 793-800.
Xiao et al., J. Mater. Chem. (2001) 11:1417-1420.
Yang et al., Crystal Growth & Design (2007) 12:2562-2567.
Yu et al., "Polymer Photovoltaic Cells: Enhanced Efficiencies via a Network of Internal Donor-Acceptor Heterojunctions," 270 Science 5243 (1995), pp. 1789-1791.
Zhong et al., Nanotechnology 18 (2007) 025602.
Barron, "Group III Materials: New Phases and Nono-particles with Applications in Electronics and Optoelectronics," Office of Naval Research Final Report (1999).
Dabousi et al., "(CdSe)ZnS Core—Shell Quantum Dots: Synthesis and Characterization of a Size Series of Highly Luminescent Nanocrystallites," Jrl. Phys. Chem.,(1997) 101, pp. 9463-9475.
Dehnen et al., "Chalcogen-Bridged Copper Clusters," Eur. J. Inorg. Chem., (2002) pp. 279-317.
Eisenmann et al., "New Phosphido-bridged Multinuclear Complexes of Ag and Zn," Zeitschrift fur anorganische und allgemeine Chemi (1995), (1 page—abstract).
Muller et al., "From Giant Molecular Clusters and Precursors to Solid-state Structures," Current Opinion in Solid State and Materials Science, 4 (Apr. 1999) pp. 141-153.
Timoshkin, "Group 13 imido metallanes and their heavier analogs [RMYR']n (M=Al, Ga, In; Y=N, P, As, Sb)," Coordination Chemistry Reviews (2005).
Vittal, "The chemistry of inorganic and organometallic compounds with adameantane-like structures," Polyhedron, vol. 15, No. 10, pp. 1585-1642 (1996).
Zhong et al, "Composition-Tunable ZnxCu1-xSe Nanocrytals with High Luminescence and Stability", Jrl Amer. Chem. Soc. (2003).
International Search Report and Written Opinion for PCT/GB2006/003028 mailed Jan. 22, 2007 (15 pages).
Nielsch et al., "Uniform Nickel Deposition into Ordered Alumina Pores by Pulsed Electrodepositioin", Advanced Materials, 2000 vol. 12, No. 8, pp. 582-586.
Huang et al., "Bio-Inspired Fabrication of Antireflection Nanostructures by Replicating Fly Eyes", Nanotechnology (2008) vol. 19.
Materials Research Society Symposium Proceedings Quantum Dots, Nanoparticles and Nanowires, 2004, ISSN: 0272-9172.
Xie et. al., "Synthesis and Characterization of Highly Luminescent CdSe-Core CdS/Zn0.5Cd0.5S/ZnS Multishell Nanocrystals," JACS Articles published on web Apr. 29, 2005.
Kim et. al., "Engineering InAsxP1-x/LnP/ZnSe III-V Alloyed Core-Shell Quantum Dots for the Near-Infrared." JACS Articles published on web Jul. 8, 2005.

* cited by examiner

QDs (3-10nm)   Dispersion Polymerisation Beads   Suspension Polymerisation Beads

ENCAPSULATED NANOPARTICLES

RELATED APPLICATIONS

This application is a continuation of U.S. patent application Ser. No. 13/075,458, filed Mar. 30, 2011, which claims the benefit of and priority to GB Application No. 1005601.8 filed Apr. 1, 2010 and U.S. Provisional Patent Application Ser. No. 61/320,924 filed Apr. 5, 2010, the disclosures of which are incorporated herein by reference in their entireties.

FIELD OF THE INVENTION

The present invention relates to a method for producing encapsulated nanoparticles and encapsulated nanoparticles per se. The invention relates particularly, but not exclusively, to polymer-encapsulated core and core/(multi)shell quantum dots which, as a result of their encapsulation, can be utilized in a wide range of applications, including biolabeling, biosensing, coding, biological monitoring, security optical coding, biological assays, solid state lighting, optical data storage, sensors and anti-counterfeiting.

BACKGROUND

Fluorescent dye-containing beads have been used for many years in diagnostics testing, microscope- and flow cytometry-based assays, and combinatorial library synthesis. As such they can be routinely manufactured with a variety of surface modifications which enable many classes of molecules to be coupled and subsequently read and manipulated using commercially available instrumentation. The fluorescent organic dye molecules suffer from a number of disadvantages however including photo-bleaching, different excitation irradiation frequencies and broad emissions. Alternatives to conventional fluorescent materials have therefore been investigated. The substitution of the fluorescent organic molecules with luminescent compound semiconductor nanoparticles or "quantum dots" (QDs) is one approach which is intended to circumvent many of these limitations.

The size of a QD dictates the electronic properties of the material; the band gap energy being inversely proportional to the size of the QDs as a consequence of quantum confinement effects. Different sized QDs may be excited by irradiation with a single wavelength of light to give a discrete fluorescence emission of narrow band width. Further, the large surface area to volume ratio of the QDs has a profound impact upon the physical and chemical properties of the QD.

Nanoparticles that comprise a single semiconductor material usually have modest physical/chemical stability and consequently relatively low fluorescence quantum efficiencies. These low quantum efficiencies arise from non-radiative electron-hole recombinations that occur at defects and dangling bonds at the surface of the nanoparticle.

Core-shell nanoparticles comprise a semiconductor core with a shell material of typically wider band-gap and similar lattice dimensions grown epitaxially on the surface of the core. The shell eliminates defects and dangling bonds from the surface of the core, which confines charge carriers within the core and away from surface states that may function as centers for non-radiative recombination. More recently, the architecture of semiconductor nanoparticles has been further developed to include core/multi-shell nanoparticles in which the core semiconductor material is provided with two or more shell layers to further enhance the physical, chemical and/or optical properties of the nanoparticles. To add further stability, a compositionally graded alloy layer can be grown epitaxially on to the nanoparticle core to alleviate lattice strain between adjacent layers that could otherwise lead to defects and reduce the photoluminescence (PL) emission of the QDs. The emission and absorption properties of the QDs can also be manipulated by doping wide band gap materials with certain metals or luminescence activators to further tune the PL and electroluminescence (EL) at energies even lower than the band gap of the bulk semiconductor material, whereas the quantum size effect can be exploited to tune the excitation energy by varying the size of the QDs without having a significant affect on the energy of the activator-related emission.

The surfaces of core and core/(multi)shell semiconductor nanoparticles often possess highly reactive dangling bonds, which can be passivated by coordination of a suitable ligand, such as an organic ligand compound. The ligand compound is typically either dissolved in an inert solvent or employed as the solvent in the nanoparticle core growth and/or shelling procedures that are used to synthesize the QDs. Either way, the ligand compound chelates the surface of the QD by donating lone pair electrons to the surface metal atoms, which inhibits aggregation of the particles, protects the particle from its surrounding chemical environment, provides electronic stabilization and can impart solubility in relatively non-polar media.

SUMMARY

Various methods have been developed to try to incorporate QDs into beads in the form of resins, polymers, monoliths, glasses, sol gels, silicones, acrylates and other media. The term "beads" is used simply for convenience and is not intended to impose any particular shape or size limitation or composition. It relates to a solid-state medium of any three dimensional shape of any size and of any composition. For example, beads may be spherical but other configurations are also contemplated.

One of the approaches to incorporating QDs into beads that has been investigated significantly to-date involves pre-coating the QDs with specific types of ligands, which are either polymerizable or compatible with the intended encapsulating polymer. Examples of polymerization methods that may be used to construct QD-containing beads include suspension, dispersion, emulsion, living, anionic, cationic, RAFT, ATRP, bulk, ring closing metathesis and ring opening metathesis. Initiation of the polymerization reaction may be caused by any appropriate technique, including free radicals, light, ultrasound, cations, anions, or heat. Examples of polymer-compatible QD surface ligands include ligands that may be hydrophobic, hydrophilic, positively or negatively charged, or functionalized with a reactive group capable of associating with the encapsulating polymer by chemical reaction, covalent linkage, or non-covalent interaction (intercelation). In an alternative approach, QDs have been immobilized in polymer beads through physical entrapment. A solution of QDs in an organic solvent is incubated with a sample of polymer beads. The solvent is then removed, resulting in the QDs becoming immobilized within the matrix of the polymer beads at which point the beads typically require some form of sealing procedure to be carried out to ensure the QDs remain immobilized within the beads. Unfortunately, while progress has been made, most of the approaches currently being investigated to encapsulate nanoparticles require processing steps which can be damaging to the integrity and/or optical performance of the QDs.

An object of the present invention is to obviate or mitigate one or more of the problems currently associated with the production of encapsulated semiconductor nanoparticles.

A first aspect of the present invention provides a method for producing encapsulated nanoparticles comprising dispersion of said nanoparticles and an encapsulating medium in a common solvent to form a first solution system and treatment of said first solution system with a stimulus suitable to induce simultaneous aggregation of the nanoparticles and the encapsulating medium.

A second aspect of the present invention relates to encapsulated nanoparticles produced using a method according to the first aspect of the present invention.

The present invention relates to the incorporation of nanoparticles, including for example, QDs, colloidal gold, colloidal silver, metal oxides etc., into an encapsulating medium which is preferably optically transparent, and is most preferably optically clear. It is preferred that the encapsulating medium is physically and chemically stable and sufficiently robust to withstand the conditions to which the resulting QD-containing beads will be subjected during their intended application.

In preferred embodiments of the method of the present invention the method can be separated into two fundamental stages. In a first stage, a solution system comprising the nanoparticles and the intended encapsulating medium (e.g. the encapsulating polymer) is formed using a common solvent that can uniformly disperse or dissolve both the nanoparticles and the encapsulant. In a second stage, the nanoparticle/encapsulant solution system is treated so as to undergo a physical and/or chemical change resulting in simultaneous aggregation of the nanoparticles and the encapsulating medium.

The treatment effected in the second step may involve contacting of the initial nanoparticle/encapsulant solution system with another solvent system possessing different polarity which destabilizes the initial solution system and induces the formation of nanoparticle/encapsulant aggregates. By way of further example, the second step may comprise a chemical change such as a change in pH, addition of a salting-out agent (e.g. an electrolyte such as sodium sulfate), or addition of a chaotropic agent (i.e. an agent which disrupts the structure of the nanoparticle/encapsulant solution system by interfering with intra-molecular interactions mediated by non-covalent forces which stabilize the initial solution system). Additionally, the second step may involve a physical change, such as a change in temperature of the nanoparticle/encapsulant solution system.

The resulting material is an ensemble of aggregated beads that consist of both the nanoparticles and the encapsulant. By changing the ratio and sequence of additions of the first and second systems, the size, loading ratio and uniformity of the encapsulating particles, e.g. beads, may be controlled. In an optional further step, the beads can be rigidized chemically and/or physically by solvent removal (de-solvation) and/or additional crosslinking to form self-supporting beads.

Producing QD-containing beads using the method of the present invention has the advantage very little loss of quantum yield during processing as a result of using relatively mild conditions. Other advantages include the ability to produce beads with a high loading of nanoparticles and the ability to easily and conveniently scale-up production to large, commercially relevant volumes.

Methods sharing certain features with the method of the present invention have been developed previously for encapsulating small organic molecules, such as drug and dye molecules. Drug encapsulation has been investigated for various reasons including controlled release and minimizing unwanted side effects. Encapsulation of dye molecules has been used, for example, in the preparation of "carbonless paper". These methods are, however, tailored specifically for the encapsulation of relatively small organic molecules which are quite distinct from the present invention which relates to the encapsulation of significantly larger nanoparticles, particularly, but not exclusively, inorganic compound semiconductor nanoparticles or QDs, which exhibit tunable luminescent properties. Smaller organic molecules will typically dissolve in a wider range of solvents than much larger inorganic materials, and molecules such as drug or dye molecules tend to form more stable colliodal dispersions more easily than nanoparticle-sized inorganic materials. As a result, it will be evident to the skilled person that the physical and chemical requirements of the common solvent used to disperse the nanoparticles and polymeric encapsulating medium to form the first solution system will be different to those of a solvent used to disperse a small organic molecule and its intended encapsulating medium. Moreover, the types of stimuli that may be appropriate to induce simultaneous aggregation of a population of nanoparticles and an encapsulating medium would be entirely different from those used if the nanoparticles were replaced with much smaller organic molecules. As such, it is not possible to derive any teaching or suggestion as to how to put into effect the method of the present invention from prior art methods of encapsulating small organic molecules.

The nanoparticles may be semiconductor nanoparticles, colloidal metal (e.g. Au or Ag) nanoparticles or metal oxide materials. Preferably the nanoparticles are luminescent compound semiconductor nanoparticles or QDs. The nanoparticles may incorporate a core comprised of a semiconductor material, preferably a luminescent semiconductor material. The semiconductor material may incorporate ions from any one or more of groups 2 to 16 of the periodic table, including binary, ternary and quaternary materials, that is, materials incorporating two, three or four different ions respectively. By way of example, the nanoparticles may incorporate a core semiconductor material, such as, but not limited to, CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge and combinations thereof. Nanoparticles according to the present invention preferably possess cores with mean diameters of less than around 20 nm, more preferably less than around 15 nm and most preferably in the range of around 2 to 5 nm.

Nanoparticles that comprise a single semiconductor material, e.g. CdS, CdSe, ZnS, ZnSe, InP, GaN, etc usually have relatively low quantum efficiencies arising from non-radiative electron-hole recombination that occur at defects and dangling bonds at the surface of the nanoparticles. In order to at least partially address these issues, the nanoparticle cores may be at least partially coated with one or more layers (also referred to herein as "shells") of a different material to the core, for example a semiconductor material. The material comprised in the or each shell may incorporate ions from any one or more of groups 2 to 16 of the periodic table. Where a nanoparticle comprises two or more shells, each shell is preferably formed of a different material. In an exemplary core/shell material, the core is formed of one of the materials specified above and the shell is comprised of a semiconductor material of larger band-gap energy and similar lattice dimensions to the core material. Example shell materials include, but are not limited to, ZnS, MgS, MgSe, MgTe, GaN and metal oxides, such as ZnO, $Fe_2O_3$ and $Fe_3O_4$. The confinement of charge carriers within the core and away from surface states provides QDs of greater stability and higher quantum yield.

The mean diameter of the nanoparticles may be varied to modify the emission-wavelength. The energy levels and hence the frequency of the nanoparticle fluorescence emission can be controlled by the material from which the nanoparticles are made and the size of the nanoparticles. Generally, nanoparticles made of the same material have a more pronounced red emission the larger the nanoparticle. It is preferred that the nanoparticles have mean diameters of around 1 to 15 nm, more preferably around 1 to 10 nm. The nanoparticles preferably emit light having a wavelength of around 400 to 900 nm, more preferably around 400 to 700 nm.

The coordination layer around the final inorganic surface atoms in any core, core-shell or core-multi shell, doped or graded nanoparticle is incomplete; with highly reactive non-fully coordinated atoms "dangling bonds" on the surface of the particle, which can lead to particle agglomeration. This problem is overcome by passivating (capping) the "bare" surface atoms with protecting organic groups. The outermost layer (capping agent) of organic material or sheath material helps to inhibit particle-particle aggregation and also further protects the nanoparticle from their surrounding electronic and chemical environments and it also provide a means of chemical linkage to other inorganic, organic or biological material. In many cases, the capping agent is the solvent that the nanoparticle preparation is undertaken in, and consists of a Lewis base compound, or a Lewis base compound diluted in an inert solvent such as a hydrocarbon. There is a lone pair of electrons on the Lewis base capping agent that is capable of donor-type coordination to the surface of the nanoparticle. Examples of such capping agents include mono- or multi-dentate ligands such as phosphines (trioctylphosphine, triphenylphosphine, t-butylphosphine etc.), phosphine oxides (trioctylphosphine oxide, triphenylphosphine oxide etc.), alkyl phosphonic acids, alkyl-amines (hexadecylamine, octylamine etc.), aryl-amines, pyridines, long chain fatty acids, thiophenes and the like.

The QD capping agent may also consist of a coordinated ligand that processes additional functional groups that can be used as chemical linkage to other inorganic, organic or biological material, whereby the functional group is pointing away from the QD surface and is available to bond/react/interact with other available molecules, such as amines, alcohols, carboxylic acids, esters, acid chloride, anhydrides, ethers, alkyl halides, amides, alkenes, alkanes, alkynes, allenes, amino acids, azides, groups etc. The capping agent may also consist of a coordinated ligand that processes a functional group that is polymerisable and can be used to form a polymer layer around the particle.

The capping agent can also consist of organic units that are directly bonded to the outermost inorganic layer such as via a disulfide (S—S) bond between the inorganic surface (e.g. ZnS) and a thiol capping molecule. These can also possess additional functional group(s), not bonded to the surface of the particle, which can be used to form a polymer around the particle, or for further reaction/interaction/chemical linkage.

QD-containing beads according to the present invention may contain different sizes and/or types of QDs. For example, a QD-containing bead may contain one, two or more different types of QD. Depending upon the number of each QD present, the QD-containing bead will provide a particular overall color upon excitation. These properties allow for color tuning within the bead by the combination of different amounts of different color QDs within separate beads. It is possible to produce QD-containing beads which emit light of any desirable color, such as white light, by mixing suitable populations of red QDs, green QDs and Blue QDs within the same larger bead. This 'color mixing' of the QDs can be achieved either within the QD-containing beads, i.e. each bead contains a number of differently sized and/or colored QDs, and/or a mixture of differently colored beads with all the QDs within a specific bead being the same size and/or color, i.e. some beads containing all green QDs others containing all red QDs etc.

The versatility of the method of the present invention allows the use of wide varieties of polymers and carrier materials to form beads embedded with nanoparticles, particularly QDs. In principle, all types of polymers whether organic, or inorganic, water soluble or organic solvent soluble, biological or synthetic are suitable candidates. For example, the following simple linear chain polymers may be used polyacrylate, polycarbonate, poly(o-cresylglycidylether)-co-formaldehyde, polystyrene, polyethylene, polypropylene, poly ketone, polyether ether ketone, polyesters, polyamide, polyimide, polyacrylamide, polyolefines, polyacetylene, polyisoprene, polybutadiene, PVDF, PVC, EVA, PET, polyurethane, cellulose polymers (e.g., ethylcellulose, isopropylmethylcellulose phthalate, nitrocellulose), polyvinyl alcohol (PVA) and polyvinyl acetate (PVAc), polyvinylphenol. Further examples include cross-linked polymers and/or copolymers, triblock copolymers and UV- and thermal curing epoxy. Clay materials such as bentonite, kaolin, fumed silica (e.g., cab-o-sil), fumed alumina, fumed zinc oxide, inorganic polymers can be used as the encapsulating medium alone or as additives to organic encapsulating polymers in order to improve the performance of the final QD-containing beads. The method according to the present invention may employ any of the polymers and materials indicated above alone or in combination with one or more of other suitable polymers and materials.

As well as encapsulating nanoparticles directly into the encapsulating medium, the method of the present invention also encompasses the encapsulation of nanoparticles which are already fully or partly contained or encapsulated within an encapsulating medium. Thus, the method of present invention may comprise the encapsulation of pre-existing nanoparticle-containing beads into larger beads, preferably polymeric beads, formed of the encapsulating medium. The pre-existing nanoparticle-containing beads can be pre-prepared by any desirable process, including a process according to the present invention.

The pre-prepared beads with the nanoparticles may be encapsulated into a bigger bead system by using the same process of aggregating both the pre-prepared beads (with the nanoparticles) and the system that makes the larger encapsulating beads, by applying a stimulus to the carrier solution (e.g., when the chemical environment is changed) to induce co-aggregation of the pre-prepared beads and the encapsulating system.

In the case that the nanoparticles are QDs, a 'core-shell' QD-bead architecture may confer even greater protection against the degradation of the electronic properties of the encapsulated QDs compared to 'simple' QD-containing beads in which the QDs are encapsulated directly within a bead. The encapsulation of QD-containing beads into secondary 'shelling' beads produces QD-based materials which are particularly robust. QD leakage from the beads is minimized, making these materials prime candidates for a variety of applications in relatively harsh environments. For example, core-shell encapsulated QD-beads may mask any potential toxicity of the QDs in biological applications. Moreover, populations of differently colored beads may be embedded in a single, robust, larger bead, thus enabling the development of color-coded beads that can be used for multiplexed applications like anti counterfeiting and various complicated tagging systems.

Another advantage of core-shell nanoparticle-containing beads is that it is possible to minimize problems related to any incompatibility between the nanoparticle surface and the material, e.g. polymer, forming the outermost layer of the bead material which is required for a particular application. For example, it may be advantageous to embed nanoparticles capped with an organic surface binding ligand initially into beads made of a hydrophobic polymer, and then design a core-shell bead architecture by encapsulating the beads formed initially into larger beads comprised of a hydrophilic polymer to impart novel surface properties, for example, water solubility. Moreover, the same concept can be applied to core-shell beads in which the inner beads are comprised of a polymeric material which is of different or opposite charge to the polymeric material comprised in the outer bead(s).

The method of the present invention preferably involves the initial step of dispersing a population of nanoparticles and an encapsulating medium, which is intended ultimately to encapsulate the nanoparticles, in a common solvent. The resulting solution system may be sufficiently stable when consisting solely of the nanoparticles, encapsulant and common solvent. In some applications it may be desirable to include one or more further species within the solution system, such as an additive to stabilize the dispersion of nanoparticles within the solution system. The method then preferably includes the step of destabilizing the solution system by treating it with a suitable stimulus, such as a physical change, like an increase or decrease in temperature, or a chemical change, for example, the addition of a different solvent or mixture/blend of solvents, a change in pH, addition of a salting-out agent or a chaotropic agent.

In preferred embodiments of the method of the present invention a sample of nanoparticles (e.g. core/shell QDs, such as III-V/II-VI or, more specifically InP/ZnS) are dispersed in a suitable organic solvent (e.g. dichloromethane or toluene) together with an organic polymer which is intended to form the encapsulating bead material (e.g. polycarbonate, polybutadiene, polyisoprene, polyethylene, epoxy or poly(o-cresylglycidylether)-co-formaldehyde). The solvent must be chosen so that it can form a stable dispersion with the particular encapsulating polymer as well as the nanoparticles. Dichloromethane is preferred for use with polycarbonate, poly(o-cresylglycidylether)-co-formaldehyde and epoxy, while toluene is preferred for use with polybutadiene, polyisoprene and polyethylene.

Depending upon the nature of the encapsulating polymer being used it may be necessary first to heat the polymer up to or beyond its melting point, optionally in the presence of the organic solvent, before adding the nanoparticles to form an initial solution system. This is may be necessary, for example, when using polyethylene as the encapsulating polymer.

The nanoparticles may be combined with the encapsulating polymer and the solvent in the presence of a small amount (e.g. up to around 10 wt. %, more preferably around 1 to 7 wt. %, still more preferably around 5 wt. % or around 1-2 wt. %) of an additive, which is used to stabilize the nanoparticles within the resulting solution system. Suitable additives incorporate a nanoparticle surface binding moiety and a moiety compatible with the solvent. Convenient additives include fatty acids, such as steric acid, which can bind to the surface of the nanoparticles via their terminal carboxyl groups, while their long hydrocarbon tails are directed outwardly, away from the nanoparticles into the organic solvent. The use of an additive, such as a fatty acid, is preferred when the encapsulating polymer is polycarbonate, poly(o-cresylglycidylether)-co-formaldehyde, polybutadiene, polyisoprene or polyethylene. Still further preferred additives are based on saccharides and/or anti-oxidants, such as trehalose. It is preferred that such saccharide-based additives are silylated at some or all available positions within the sugar. Silylation is preferably achieved using trimethylsilyl groups. A particularly preferred additive, which is eminently useful for use with polycarbonate or poly(o-cresylglycidylether)-co-formaldehyde as the encapsulant, is trimethylsilyl-D-(+)-trehalose. When the encapsulating polymer is an epoxy it is preferred not to use a fatty acid-based additive.

The nanoparticle-containing solution system is then preferably contacted by a second solution system, which acts as a stimulus to destabilize the initial nanoparticle-containing solution system and induce spontaneous aggregation of the nanoparticles within discrete beads of the encapsulating polymer. The initial nanoparticle-containing solution system may be introduced into the second solution system or vice versa.

The second solution system may incorporate a surfactant-type species or a non-surfactant. Preferred second solution systems include aqueous solutions of methyl cellulose or polyethyleneglycol, silicone oil, or acetylnitrile.

The second solution system may include a polarity modifying agent which can be used to optimize the polarity of the second solution system. This provides a means by which the relative polarities of the first and second solution systems can be controlled, which can be used to influence the size and number of final nanoparticle-containing beads produced. While the inventors do not wish to be bound by any particular theory, it is believed that a lower difference in polarity between the first and second solvent systems generally produces a higher number of smaller nanoparticle-containing beads. Any appropriate amount of a polarity modifying agent may be added to the second solution system. By way of example, the polarity modifying agent may represent up to around 40 to 50% (V/V) of the second solution system. More preferably around 5 to 30% (V/V) or around 10 to 25% (V/V) of the second solution system may be the polarity modifying agent. Most preferably the polarity modifying agent represents around 20% (V/V) of the second solution system.

Following contacting of the two solution systems for a suitable period of time the original organic solvent may then be removed and the nanoparticle-containing polymer beads isolated and washed. Methyl cellulose is the preferred stimulus to induce spontaneous aggregation of the nanoparticle-beads and is particularly suitable for use with polycarbonate, polybutadiene and polyisoprene encapsulating polymers. If it is desired to produce smaller nanoparticle-containing beads in methyl cellulose then an amount of tetrahydrofuran can be added to the methyl cellulose to reduce the difference in polarity between the first and second solution systems, with the result of producing a greater number of smaller nanoparticle-containing beads. Other polarity modifiers may be used. Generally it is preferred that the polarity modifier is miscible in water and has a polarity index of around 4. Preferred examples include dioxane, acetonitrile, n-propanol, iso-propanol, methyl ethyl ketone and the like. Acetylnitrile may be used instead of methyl cellulose, particularly with polycarbonate as the encapsulating polymer. Polyethyleneglycol is particularly suitable for use with polyethylene as the encapsulating polymer. Silicone oil is the preferred stimulus for use when epoxy is the encapsulating polymer.

Once nanoparticle-encapsulant aggregation has generated the nanoparticle-containing beads it may be desirable to subject the beads to a further treatment step to improve their physical characteristics. For example, when an epoxy encapsulating polymer has been used, it is preferred that the initial nanoparticle-containing epoxy beads are subjected to a suitable heat treatment process over a sufficient period of time to crosslink and 'set' the epoxy, thereby increasing the strength and robustness of the final epoxy beads.

The quantum efficiency of InP/ZnS nanoparticles encapsulated in a range of polymers employing the preferred embodiments of the method according to the present invention as explained above has been determined as around 20 to 40%. More specifically, InP/ZnS QDs encapsulated within polycarbonate beads exhibited a PLQY of 35%; InP/ZnS QDs within polybutadiene beads exhibited a PLQY of 31%; InP/ZnS QDs within polyisoprene beads exhibited a PLQY of 23%; InP/ZnS QDs within polyethylene beads exhibited a PLQY of 24%; and InP/ZnS QDs within epoxy beads exhibited a PLQY of 20.3%.

The present invention relates to a method for producing encapsulated nanoparticles, particularly, but not exclusively, QD-containing polymeric beads, as well as the materials per se. The encapsulating material, also referred to herein as the "encapsulant," is preferably an optically transparent or clear medium. QD-containing beads, preferably polymeric beads, produced by the method of the present invention have a number of advantages. The manufacturing process is relatively simple and avoids the use of harsh conditions, which therefore limits the potential damages that can occur to the QDs during encapsulation. As a result, the QDs embedded in the beads retain their original electronic properties to a greater extent than when encapsulated using prior art techniques. Additional benefits include the fact that the QDs have increased protection compared to bare QDs from the surrounding chemical environment and photo-oxidation, as well as greater tolerance to processing conditions necessary for incorporation into solid state structures. The simplicity and ease of the method of the present invention permits large scale production of beads embedded with nanoparticles (QDs, colloidal metals, metal oxides etc.). Moreover, the ability to incorporate the nanoparticles into a variety of materials, including a wide range of polymers, confers better dispersibility and processability to the original QDs in the types of different mediums, such as resins, that are commonly used in applications like bio-labeling, light-emitting diodes (LEDs), solar cells, and lasers.

It will be appreciated that the scope of the present invention is not limited to the preferred embodiments described above and the Examples described below and that said embodiments and Examples may be modified without departing from the basic concept underlying each aspect of the present invention defined above.

BRIEF DESCRIPTION OF THE FIGURES

The present invention is illustrated with reference to the following non-limiting Examples and Figures in which.

SYNTHETIC METHODS

Figure 1:
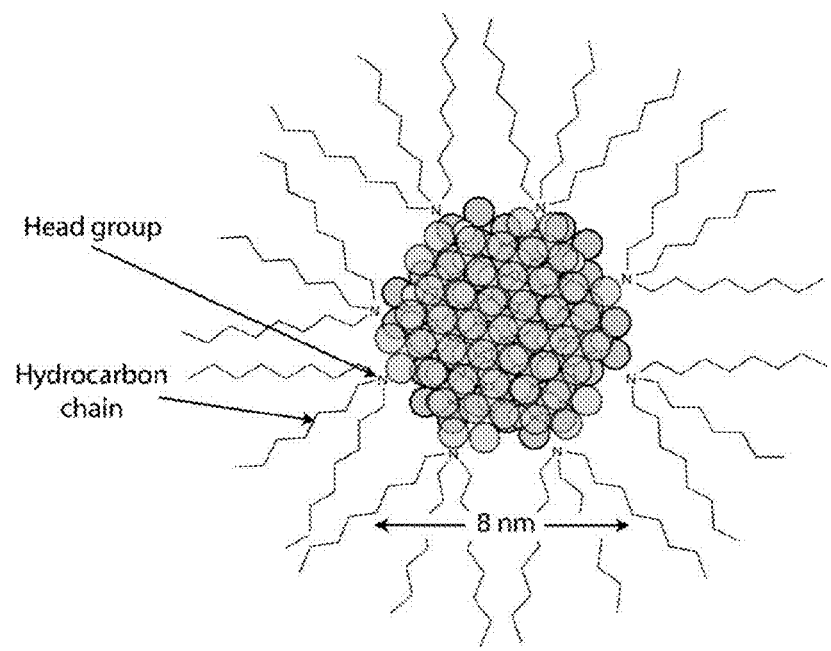
FIG. 1 is a schematic illustration of a QD surrounded by an amine capping agent.
Figure 2:
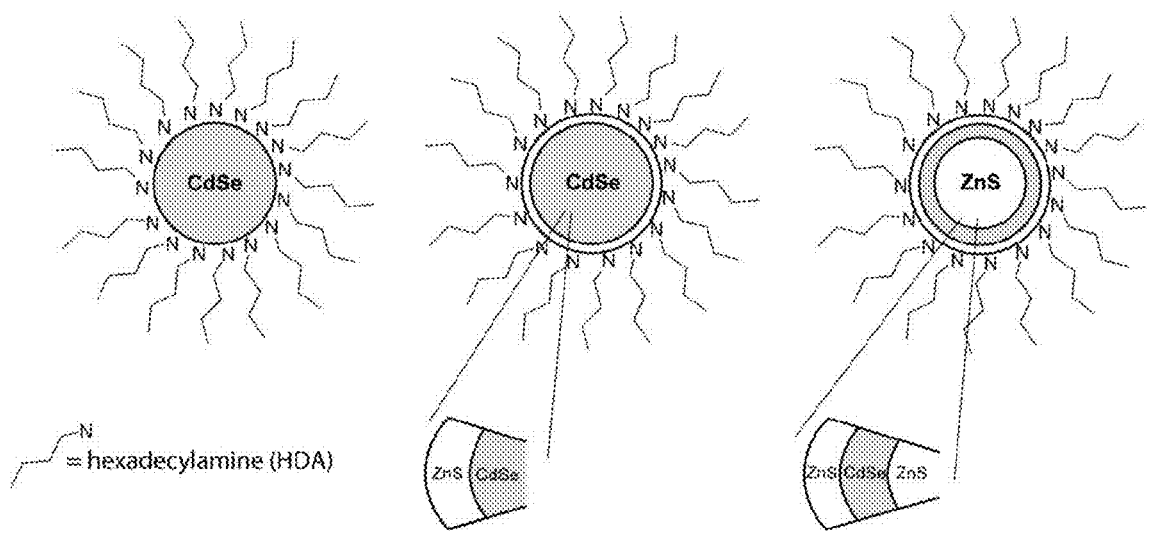
FIG. 2 is a schematic illustration of core, core/shell, and core/multi-shell QDs, each with an amine capping agent.
Figure 3:
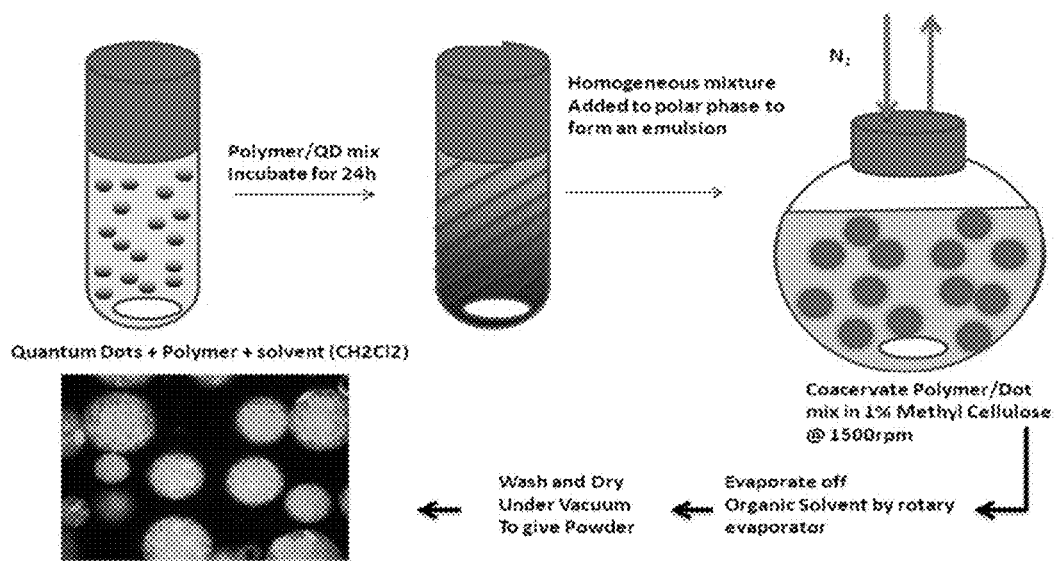
FIG. 3 is a schematic representation of a preferred embodiment of a method according to an aspect of the present invention.
Figure 4:
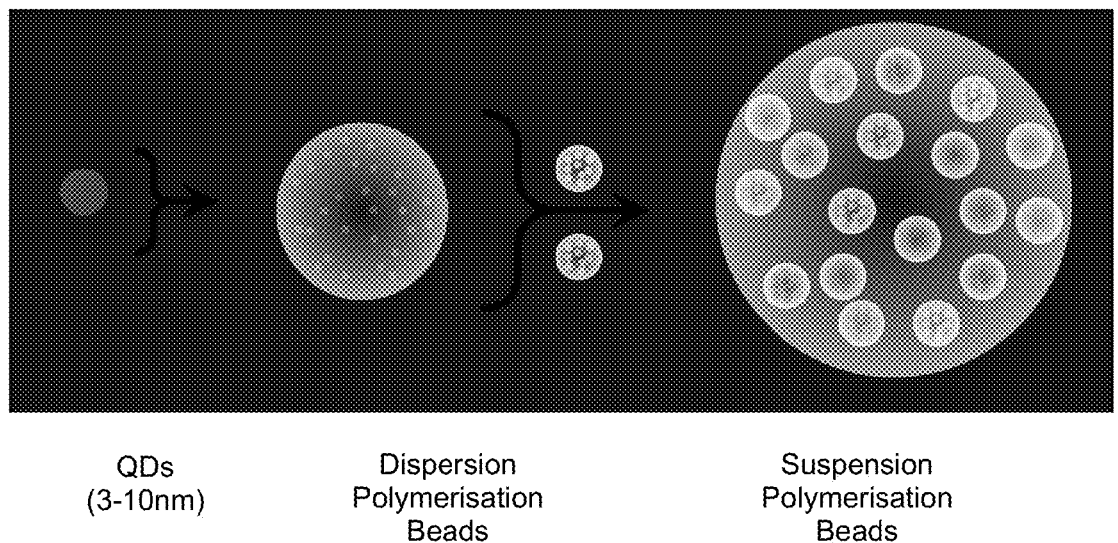
FIG. 4 is a schematic representation of a preferred embodiment of a process according to an aspect of the present invention in which different colored QDs are dispersed separately in polymer beads to produce a variety of beads of a single color, and which are then combined in any desirable ratio in a single larger polymer bead such that the larger bead is of a desired color.
Figure 5:
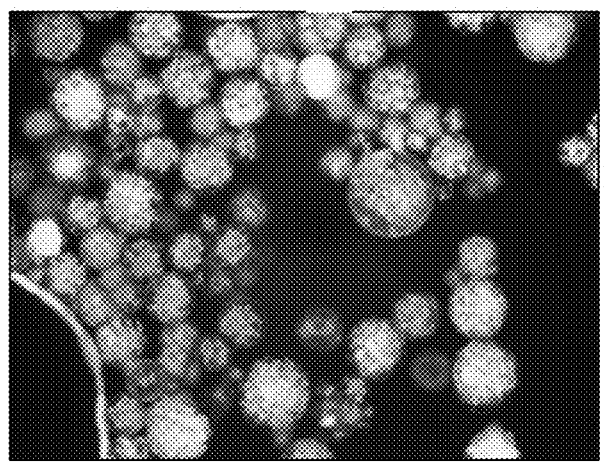
FIG. 5 is a fluorescence microscopy image of QD-containing polystyrene beads (diameter of around 5 micron) contained within larger polycarbonate beads (diameter of around 50 micron) produced using a method according to a preferred embodiment of an aspect of the present invention.

Preparation of CdSe Core Nanoparticles Capped with HDA

HDA (500 g) was placed in a three-neck round bottomed flask and dried and degassed by heating to 120° C. under a dynamic vacuum for >1 hour. The solution was then cooled to 60° C. To this was added 0.718 g of $[HNEt_3]_4[Cd_{10}Se_4(SPh)_{16}]$ (0.20 mmols). In total 42 mmols, 22.0 ml of TOPSe and 42 mmols, (19.5 ml, 2.15 M) of $Me_2Cd.TOP$ was used. Initially 4 mmol of TOPSe and 4 mmols of $Me_2Cd.TOP$ were added to the reaction at room temperature and the temperature increased to 110° C. and allowed to stir for 2 hours. The reaction was a deep yellow color, the temperature was progressively increased at a rate of ~1° C./5 min with equimolar amounts of TOPSe and $Me_2Cd.TOP$ being added dropwise. The reaction was stopped when the photoluminescence (PL) emission maximum had reached about 600 nm by cooling to 60° C. followed by addition of 300 ml of dry ethanol or acetone. This produced a precipitation of deep red particles, which were further isolated by filtration. The resulting CdSe particles were recrystallized by re-dissolving in toluene followed by filtering through Celite followed by re-precipitation from warm ethanol to remove any excess HDA, selenium or cadmium present. This produced 10.10 g of HDA capped CdSe nanoparticles. Elemental analysis C=20.88%, H=3.58%, N=1.29%, Cd=46.43%. Max PL=585 nm, FWHM=35 nm. 38.98 mmols, 93% of $Me_2Cd$ consumed in forming the QDs.

Preparation of CdSe/ZnS Core/Shell Nanoparticles Capped with HDA

HDA (800 g) was placed in a three neck round-bottom flask, dried and degassed by heating to 120° C. under a dynamic vacuum for >1 hour. The solution was then cooled to 60° C. To this was added 9.23 g of CdSe nanoparticles that have a PL maximum emission of 585 nm. The HDA was then heated to 220° C. To this was added by alternate dropwise addition a total of 20 ml of 0.5 M $Me_2Zn.TOP$ and 0.5 M, 20 ml of sulfur dissolved in octylamine. Three alternate additions of 3.5, 5.5 and 11.0 ml of each were made, whereby initially 3.5 ml of sulfur was added dropwise until the intensity of the PL maximum was near zero. Then 3.5 ml of $Me_2Zn.TOP$ was added dropwise until the intensity of the PL maximum had reached a maximum. This cycle was repeated with the PL maximum reaching a higher intensity with each cycle. On the last cycle, additional precursor was added once the PL maximum intensity been reached until it was between 5-10% below the maximum intensity, and the reaction was allowed to anneal at 150° C. for 1 hour. The reaction mixture was then allowed to cool to 60° C. whereupon 300 ml of dry "warm" ethanol was added which resulted in the precipitation of particles. The resulting CdSe/ZnS core/shell nanoparticles were dried before being re-dissolved in toluene and filtered through Celite, followed by re-precipitation from warm ethanol to remove any excess HDA. This produced 12.08 g of HDA capped CdSe/ZnS core/shell nanoparticles. Elemental analysis C=20.27%, H=3.37%, N=1.25%, Cd=40.11%, Zn=4.43%; Max PL 590 nm, FWHM 36 nm.

Preparation of InP Core Nanoparticles (Emission from 500-700 nm)

Di-butyl ester (100 ml) and Myristic acid (10.0627 g) were placed in a three-neck flask and degassed at 70° C. under vacuum for one hour. After this period, nitrogen was introduced and the temperature increased to 90° C. ZnS molecular cluster $[Et_3NH_4][Zn_{10}S_4(SPh)_{16}]$ (4.7076 g) was added and the mixture allowed to stir for 45 minutes. The temperature was then increased to 100° C. followed by the dropwise addition of $In(MA)_3$ (1 M, 15 ml) followed by $(TMS)_3P$ (1 M, 15 ml). The reaction mixture was allowed to stir while increasing the temperature to 140° C. At 140° C., further dropwise additions of $In(MA)_3$ (1 M, 35 ml) (left to stir for 5 minutes) and $(TMS)_3P$ (1 M, 35 ml) were made. The temperature was then slowly increased to 180° C. and further dropwise additions of $In(MA)_3$ (1 M, 55 ml) followed by $(TMS)_3P$ (1 M, 40 ml) were made. By addition of the precursor in the manner above nanoparticles of InP can be grown with an emission maximum gradually increasing from 520 nm up to 700 nm, whereby the reaction can be stopped when the desired emission maximum has been obtained and left to stir at this temperature for half an hour. After this period, the temperature was decreased to 160° C. and the reaction mixture was left to anneal for up to 4 days (at a temperature around 20 to 40° C. below that of the reaction). A UV lamp was also used at this stage to aid in annealing.

The InP nanoparticles were isolated by the addition of dried degassed methanol (approx. 200 ml) via cannula techniques. The precipitate was allowed to settle and then methanol was removed via cannula with the aid of a filter stick. Dried degassed chloroform (approx. 10 ml) was added to wash the solid. The solid was left to dry under vacuum for 1 day. This produced 5.60 g of InP core nanoparticles. Elemental analysis: Max PL=630 nm, FWHM=70 nm.

Post-Preparative Treatments

The quantum yields of the InP nanoparticles prepared above were increased by washing with dilute HF acid. The nanoparticles were dissolved in anhydrous degassed chloroform (about 270 ml). A 50 ml portion was removed and placed in a plastic flask, flushed with nitrogen. Using a plastic syringe, the HF solution was made up by adding 3 ml of 60% w/w HF in water and adding to degassed THF (17 ml). The HF was added dropwise over 5 hours to the InP nanoparticles. After addition was complete the solution was left to stir overnight. Excess HF was removed by extracting through calcium chloride solution in water and drying the etched InP nanoparticles. The dried nanoparticles were re-dispersed in 50 ml chloroform for future use. PL max=567 nm, FWHM=60 nm. The quantum efficiencies of the InP core nanoparticles at this stage range from 25-90%

Preparation of InP/ZnS Core/Shell Nanoparticles

A 20 ml portion of the HF-etched InP core nanoparticles was dried down in a 3-neck flask. 1.3 g myristic acid and 20 ml di-n-butyl sebacate ester were added and degassed for 30 minutes. The solution was heated to 200° C. then 1.2 g anhydrous zinc acetate was added and 2 ml 1 M $(TMS)_2S$ added dropwise (at a rate of 7.93 ml/hr). After the addition was complete the solution was left to stir. The solution was kept at 200° C. for 1 hr then cooled to room temperature. The nanoparticles were isolated by adding 40 ml of anhydrous degassed methanol and centrifuged. The supernatant liquid was disposed of and 30 ml of anhydrous degassed hexane was added to the remaining solid. The solution was allowed to settle for 5 hours and then re-centrifuged. The supernatant liquid was collected and the remaining solid was discarded. PL emission peak Max.=535 nm, FWHM=65 nm. The quantum efficiencies of the InP/ZnS core/shell nanoparticles at this stage ranged from 35-90%.

EXAMPLES

Example 1

Preparation of InP/ZnS Core/Shell Nanoparticles Encapsulated in Polycarbonate 100 ml of a 1% w/v solution of methyl cellulose was prepared and placed in a single necked round bottom flask, under nitrogen, equipped with a magnetic stirrer and stirring at 1500 rpm. A solution containing 30 mg of InP/ZnS core/shell nanoparticles in 5 ml of dichloromethane and 500 mg of polycarbonate polymer with 1% stearic acid (incubated for 24 hours at room temperature) was injected quickly as a single shot directly into the methyl cellulose solution. The dichloromethane was removed by using a rotary evaporator set at a vacuum of 800 mbar, rotor speed 3, and a water bath temperature of 40° C. for 2-3 hours. The particles were washed three times by centrifugation with deionized water, followed by a further three times with ethanol, and then isolated as a pellet. The final pellet was dried under vacuum overnight. The quantum efficiency of the InP/ZnS nanoparticles encapsulated in the polycarbonate polymer was PLQY=35%.

Example 2

Preparation of InP/ZnS Core/Shell Nanoparticles Encapsulated in Polybutadiene 100 ml of a 1% w/v solution of methyl cellulose was prepared and placed in a single necked round bottom flask, under nitrogen, equipped with a magnetic stirrer and stirring at 1500 rpm. A solution containing 30 mg of InP/ZnS core/shell nanoparticles in 5 ml of toluene and 500 mg of polybutadiene polymer with 1% stearic acid (incubated for 1 hour at room temperature) was injected quickly as a single shot directly into the methyl cellulose solution. The toluene was removed by using a rotary evaporator set at a vacuum of 800 mbar, rotor speed 3, and a water bath temperature of 40° C. for 1 hour. The nanoparticles were washed six times with deionized water and isolated as a single piece of polymer. The quantum efficiency of the InP/ZnS nanoparticles encapsulated in polybutadiene was PLQY=31%.

Example 3

Preparation of InP/ZnS Core/Shell Nanoparticles Encapsulated in Polyisoprene 100 ml of a 1% w/v solution of methyl cellulose was placed in a single-necked round bottom flask, under nitrogen, equipped with a magnetic stirrer and stirring at 1500 rpm. A solution containing 30 mg of InP/ZnS core/shell nanoparticles in 5 ml of toluene and 500 mg of polyisoprene polymer with 1% stearic acid (incubated for 1 hour at room temperature) was injected quickly as a single shot directly into the methyl cellulose solution. The toluene was removed by using a rotary evaporator set at a vacuum of 800 mbar, rotor speed 3, and a water bath temperature of 40° C. for 1 hour. The particles were washed six times with deionized water. The quantum efficiency of the InP/ZnS nanoparticles encapsulated in polyisoprene was PLQY=23%.

Example 4

Preparation of InP/ZnS Core/Shell Nanoparticles Encapsulated in Polyethylene

A solution of 2.5 ml of polyethylene in 10 ml of toluene containing 1% of stearic acid was placed in a three-necked 100 ml round bottom flask, under nitrogen, equipped with a magnetic stirrer and stirring at 1500 rpm. The mixture was heated to melting at 120° C. under reflux. Once the solution had melted, 130 mg of InP/ZnS core/shell nanoparticles was added and the nanoparticle/polyethylene solution was allowed to stir at 120° C. under reflux for 1 hour at 1500 rpm. After this time 50 ml of polyethyleneglycol-200 (PEG-200) was injected directly down the reflux condenser. The nanoparticles were washed three times with ethanol, centrifuged and the supernatant was removed. The particles were dried under vacuum in a sealed glass tube for 24 hours. The quantum efficiency of the InP/ZnS nanoparticles encapsulated in polyethylene was PLQY=24%.

Example 5

Preparation of Organic Acid-Capped InP/ZnS Core/Shell Nanoparticles Encapsulated in Thermosetting Epoxy A 100 ml of degassed silicone oil was placed in a single necked round bottom flask, under nitrogen, equipped with a magnetic stirrer and stirring at 1500 rpm. A solution containing 30 mg of InP/ZnS core/shell nanoparticles in 5.0 ml of dichloromethane and 1 ml of epoxy (incubated for 1 hour at room temperature) was injected quickly as a single shot directly into the silicone oil solution. After nanoparticle-containing polymer particles had formed, the solution was stirred at room temperature under nitrogen for 3 days to crosslink the epoxy. A rotary evaporator, set at a vacuum of 500 mbar, rotor speed 3, and a water bath temperature of 500° C. for 1 hour, was used to remove the dichloromethane and to crosslink the epoxy. The solution was transferred to a 50 ml Vulcan™ tube and washed six times with 20 ml of hexane. The particles were dried under vacuum in a sealed glass tube for 2 hours. The quantum efficiency of the InP/ZnS nanoparticles encapsulated in thermosetting epoxy was PLQY=20.3%.

Example 6

Preparation of QDs Encapsulated in Fumed Silica

Two grams of fumed silica (e.g., Cabosil®, Aerosil®) were prepared in a flask and degassed overnight. Then 500 mg of inorganic QDs was injected and mixed by intensive stirring. The mixture was continuously stirred at 500 rpm under an N2 atmosphere at an elevated temperature of 70 to 150° C. overnight, the temperature change to 70 to 150° C. acting as the stimulus to induce simultaneous aggregation of the nanoparticles and the silica-based encapsulating medium. The solvent was then evaporated to obtain the Cabosil-encapsulated QDs in the form of a dried power.

Example 7

Trimethylsilyl-D-(+)-Trehalose as an Additive in Polycarbonate (PC) Beads Containing Quantum Dots (QDs) in Methyl Cellulose 100 ml of a 1% w/v solution of methyl cellulose was prepared and placed in a single-necked round bottom flask, under nitrogen, equipped with a magnetic stirrer. The solution was degassed using nitrogen. 30 mg of inorganic QDs were taken and the toluene evaporated off under vacuum. The QDs were re-suspended in 4.5 ml dichloromethane (DCM) plus 0.5 ml of trimethylsilyl-D-(+)-trehalose (50 mg 5% w/w polymer). 1.0 g of PC in 5.0 ml DCM was added to the QD solution and stirred until the PC dissolved. The QD/PC solution was allowed to stand at room temperature with gentle stirring for 1 h. The QD/PC solution was then added to the 100 ml of the methyl cellulose solution with stirring at 1500 rpm. The DCM was vacuumed off and the PC-encapsulated QD beads spun out of solution at 500 rpm in a centrifuge. The supernatant was removed and the PC-encapsulated QD beads were washed three times with water and then three times with ethanol. The final PC-encapsulated QD bead residue was dried under vacuum to obtain PC-encapsulated QD beads with an external quantum yield of 36%, as compared to 24% for the same type of material but produced without the addition of trimethylsilyl-D-(+)-trehalose.

Figure 6:
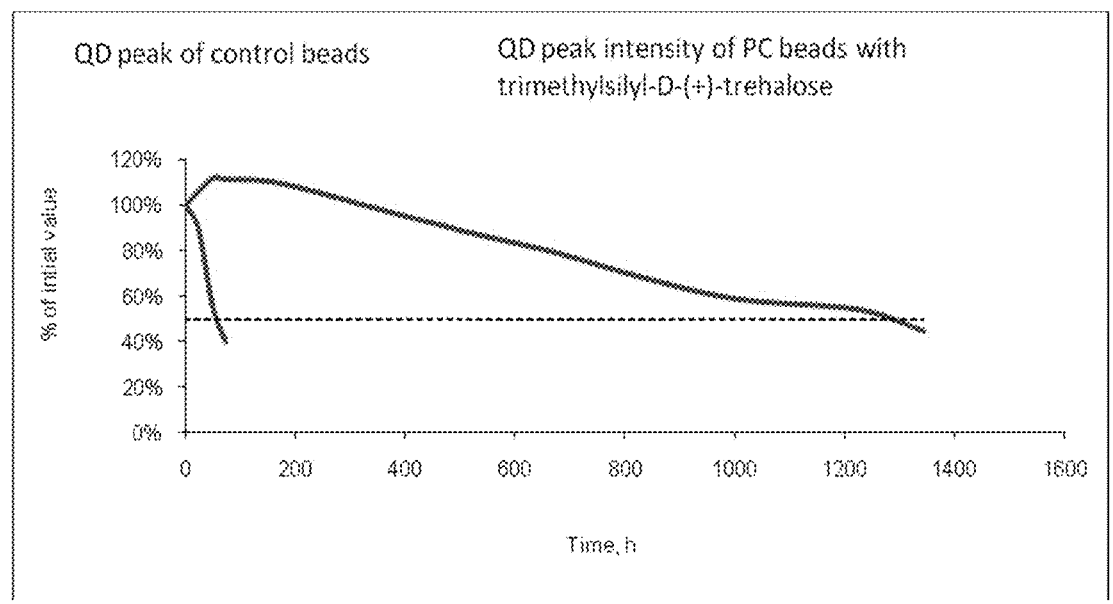
FIG. 6 is a graph comparing the stability of two samples of QDs encapsulated in polycarbonate beads.

As well as improving the final quantum yield of the PC-encapsulated QD beads, trimethylsilyl-D-(+)-trehalose also improved the stability of the QDs in the PC beads by >20 times as compared to PC beads without trimethylsilyl-D-(+)-trehalose added. This is clear from a stability study in when the beads were used as a phosphor material in LED fabrication. The results are shown in FIG. 6.

Example 8

Controlling Bead Size by Adjusting Solvent Polarity—I
Formation of QD Beads Using PC/Trehalose in 1% Methyl Cellulose with 20% THF The QD-containing particles produced above in Example 7 had a diameter of around 50 to 100 microns. Investigations were then conducted to determine how to change the diameter of the particles formed. The effect of changing the surface tension between the hydrophobic and hydrophilic phases of the solvent system in which the encapsulated QDs are produced was investigated by the addition of further solvents to the methyl cellulose to optimize its polarity.

Figure 7A:
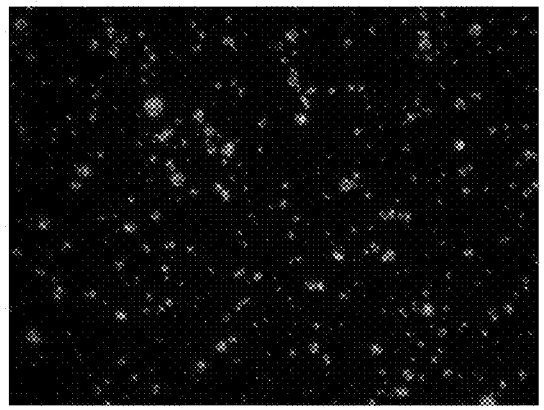
FIGS. 7a and 7b are microscopic images (at 1000× magnification) of polycarbonate beads containing QDs which have been made in the presence (FIG. 7a; refer to Example 8) and absence (FIG. 7b; refer to Example 7) of 20% THF in the outer (methyl cellulose) phase.
Figure 7B:
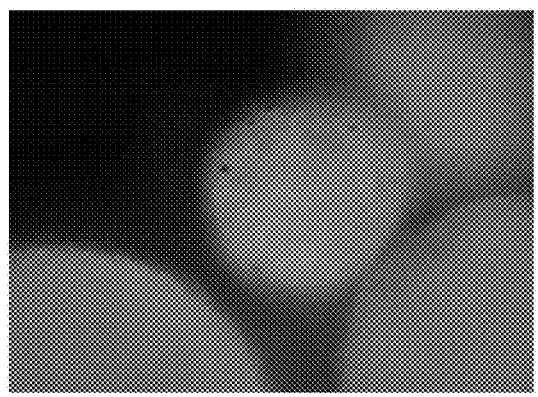

PC-encapsulated QD beads were produced using the same procedure as set out above in Example 7 except that 20% of THF (V/V) was added to the 1% methyl cellulose. This produced much smaller spherical QD-containing particles of 5-10 micron diameter (see FIG. 7).

Example 9

Figure 8:
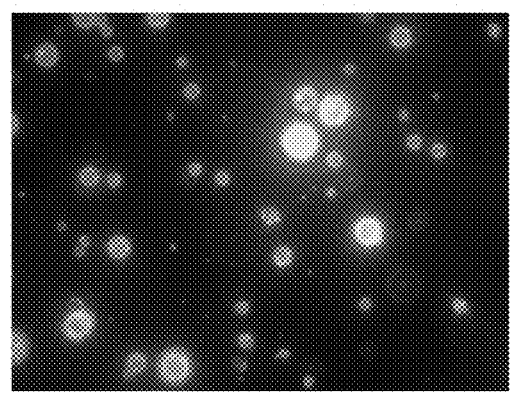
FIG. 8 is a microscopic image (at 1000× magnification) of poly(o-cresylglycidylether)-co-formaldehyde beads containing QDs which have been made in the presence of 20% THF in the outer (methyl cellulose) phase (refer to Example 9).

Controlling Bead Size by Adjusting Solvent Polarity—II
Formation of QD Beads Using Poly(o-cresylglycidylether)-co-formaldehyde/Trehalose in 1% Methyl Cellulose with 20% THF Encapsulated QD beads were produced using the same procedure as set out above in Example 8 except that the polycarbonate was replaced with poly[o-cresylglycidylether)-co-formaldehyde. This produced small spherical QD-containing particles (see FIG. 8).

We claim:

1. A method for producing encapsulated quantum dots (QDs), the method comprising:
   providing a population of beads, each bead comprising a plurality of QDs encapsulated in a first encapsulating medium;
   dispersing the beads and a second encapsulating medium in a solvent to form a mixture; and applying a stimulus to the mixture to induce simultaneous aggregation of the beads and the second encapsulating medium.

2. The method of claim 1, wherein the first encapsulating medium is a polymeric encapsulating medium selected from the group consisting of an organic polymer, an inorganic polymer, a water-soluble polymer, an organic-solvent-soluble polymer, a biological polymer, and a synthetic polymer.

3. The method of claim 1, wherein the first encapsulating medium is a polymeric encapsulating medium selected from the group consisting of polyacrylate, polycarbonate, poly(o-cresylglycidylether)-co-formaldehyde, polystyrene, polyethylene, polypropylene, poly ketone, polyether ether ketone, polyester, polyamide, polyimide, polyacrylamide, polyolefin, polyacetylene, polyisoprene, polybutadiene, poly(vinylidene fluoride), poly(vinyl chloride), ethylene vinyl acetate, polyethylenetelephthalate, polyurethane, and cellulose polymers.

4. The method of claim 1, wherein the first encapsulating medium is selected from the group consisting of a crosslinked or crosslinkable polymer, a crosslinked or crosslinkable copolymer, a triblock copolymer, a UV-curable epoxy polymer, and a thermally curable epoxy polymer.

5. The method of claim 1, wherein the first encapsulating medium is selected from the group consisting of bentonite, kaolin, fumed silica, fumed alumina, and fumed zinc oxide.

6. The method of claim 1, wherein the second encapsulating medium is a polymeric encapsulating medium selected from the group consisting of an organic polymer, an inorganic polymer, a water-soluble polymer, an organic-solvent-soluble polymer, a biological polymer, and a synthetic polymer.

7. The method of claim 1, wherein the second encapsulating medium is a polymeric encapsulating medium selected from the group consisting of polyacrylate, polycarbonate, poly(o-cresylglycidylether)-co-formaldehyde, polystyrene, polyethylene, polypropylene, poly ketone, polyether ether ketone, polyester, polyamide, polyimide, polyacrylamide, polyolefin, polyacetylene, polyisoprene, polybutadiene, poly(vinylidene fluoride), poly(vinyl chloride), ethylene vinyl acetate, polyethylenetelephthalate, polyurethane, and cellulose polymers.

8. The method of claim 1, wherein the second encapsulating medium is selected from the group consisting of a crosslinked or crosslinkable polymer, a crosslinked or crosslinkable copolymer, a triblock copolymer, a UV-curable epoxy polymer, and a thermally curable epoxy polymer.

9. The method of claim 1, wherein the second encapsulating medium is selected from the group consisting of bentonite, kaolin, fumed silica, fumed alumina, and fumed zinc oxide.

10. The method of claim 1, wherein at least one of the first and second encapsulating mediums is a methacrylate polymer and the other of the first and second encapsulating mediums is an epoxy.

11. The method of claim 1, wherein the stimulus destabilizes the mixture, inducing said simultaneous aggregation.

12. The method of claim 1, wherein the stimulus comprises a physical change to the mixture resulting in simultaneous aggregation of the nanoparticles and the encapsulating medium.

13. The method of claim 1, wherein the stimulus is a change in temperature of the mixture.

14. The method of claim 1, wherein the stimulus comprises a chemical change to the mixture resulting in simultaneous aggregation of the nanoparticles and the encapsulating medium.

15. The method of claim 1, wherein the stimulus comprises a change selected from the group consisting of changing the pH of the mixture, addition of a salting-out agent to the mixture, and adding a chaotropic agent to the mixture.

16. The method of claim 1, wherein the stimulus comprises contacting the mixture with a solution having at least one of a polarity or a chemical composition different from that of the mixture.

17. The method of claim 16, wherein the solution comprises a surfactant.

18. The method of claim 16, wherein the solution is selected from the group consisting of an aqueous solution of methyl cellulose, an aqueous solution of polyethyleneglycol, silicone oil, and acetylnitrile.

19. The method of claim 16, wherein the solution comprises a polarity-modifying agent.

20. The method of claim 19, wherein the is selected from the group consisting of dioxane, acetonitrile, n-propanol, isopropanol, and methyl ethyl ketone.

* * * * *